(12) United States Patent
Chen et al.

(10) Patent No.: US 6,872,475 B2
(45) Date of Patent: Mar. 29, 2005

(54) BINAPHTHALENE DERIVATIVES FOR ORGANIC ELECTRO-LUMINESCENT DEVICES

(75) Inventors: Jian Ping Chen, San Jose, CA (US); Xiao-Chang Charles Li, Union City, CA (US); Koichi Suzuki, Yokohama (JP); Kazunori Ueno, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/307,982

(22) Filed: Dec. 3, 2002

(65) Prior Publication Data

US 2004/0106003 A1 Jun. 3, 2004

(51) Int. Cl.⁷ .............................................. H05B 33/12
(52) U.S. Cl. .................... 428/690; 428/917; 257/40; 257/102; 257/103; 313/504; 313/506
(58) Field of Search ................. 428/690, 917; 313/504, 506; 546/37; 564/429; 257/102, 103, 40

(56) References Cited

U.S. PATENT DOCUMENTS

| | | | |
|---|---|---|---|
| 5,077,142 A | * 12/1991 | Sakon et al. ................. 428/690 |
| 5,763,238 A | 6/1998 | James et al. ................. 436/172 |
| 5,929,239 A | * 7/1999 | Langhals et al. ............. 546/37 |
| 5,985,417 A | * 11/1999 | Shi et al. .................. 428/195.1 |
| 6,084,347 A | 7/2000 | Xu et al. ..................... 313/503 |
| 6,277,503 B1 | 8/2001 | Hashimoto et al. ......... 428/690 |
| 6,280,859 B1 | 8/2001 | Onikubo et al. ............. 428/690 |
| 6,486,601 B1 | * 11/2002 | Sakai et al. .................. 313/504 |
| 6,509,109 B1 | * 1/2003 | Nakamura et al. .......... 428/690 |
| 2001/0006742 A1 | 7/2001 | Morioka et al. ............. 428/690 |
| 2001/0012571 A1 | 8/2001 | Ishikawa et al. ............. 428/690 |
| 2001/0033944 A1 | 10/2001 | Onikubo et al. ............. 428/690 |
| 2002/0045061 A1 | 4/2002 | Hosokawa .................... 428/690 |
| 2002/0058156 A1 | 5/2002 | Toguchi et al. ............. 428/690 |

FOREIGN PATENT DOCUMENTS

| | | |
|---|---|---|
| EP | 0797375 | 9/1997 |
| EP | 1013740 | 6/2000 |
| JP | 10-255984 | 9/1998 |
| JP | 11-338172 | 10/1999 |
| WO | 02/15645 | 2/2000 |

OTHER PUBLICATIONS

Jen et al., "Efficient light–emitting diodes based on a binaphthalene containing polymer", Applied Physics Letters, vol. 75(24) p 3745–3747, Dec. 13, 1999.*
L. Zheng, et al., "A Binaphthyl–Based Conjugated Polymer for Light–Emitting Diodes", Department of Chemistry, Northeatern University, Chem. Mater 12 (1), 2000 pp. 13–15.
A.K–Y. Jen, et al., "Efficient light–emitting diodes based on a binaphthalene–containing polymer", Applied Physics Letters, vol. 75, No. 24, Dec. 13, 1999, pp. 3745–3747.
X. Jiang, et al., "High–performance blue light–emitting diode based on a binaphthyl–containing polyfluorene", Applied Physics Letters, vol. 76, No. 14, Apr. 3, 2000, pp. 1813–1815.

(Continued)

*Primary Examiner*—Rena Dye
*Assistant Examiner*—Carrie S Thompson
(74) *Attorney, Agent, or Firm*—Fitzpatrick, Cella, Harper & Scinto

(57) ABSTRACT

The present invention relates to an organic light emitting device (OLED) in which a binaphthalene derivative is used as the emissive layer and/or one or more of the charge transport layers, or as a host or dopant material for one or more of such layers.

4 Claims, 3 Drawing Sheets

DSC curve of compound (2).

OTHER PUBLICATIONS

Ostrowski et al., "Glass–Forming Binaphthyl Chromophores", Chem. Eur. J., vol. 7, No. 20, pp. 4500 to 4511 (2001).

Lin Pu, "Novel chiral conjugated macromolecules for potential electrical and optical applications", Macromol. Rapid Commun., vol. 21, No. 12, pp. 795 to 809 (2000).

Diez–Barra, et al., "Synthesis of New 1,1'–Binaphthyl–Based Chiral Phenylenevinylene Dendrimers", Org. Lett., vol. 2, No. 23, pp. 3651 to 3653 (2000).

Musick, et al., "Synthesis of Binaphthyl–Oligothiophene Copolymers with Emissions of Different Colors: Systematically Tuning the Photoluminescence of Conjugated Polymers", Macromolecules, vol. 31, No. 9, pp. 2933 to 2942 (1998).

Hartwig, J.E., "Transition Metal Catalyzed Syntheis of Arylamines and Aryl Ethers from Aryl Halides and Triflates: Scope an dMechanism", Angewandte Chemie International Edition English, vol. 37, p. 2047 (1998).

Jen, A. K., "Materials Science and Engineering," Department of Materials Science & Engineering, University of Washington.

Li, X. C., Liu, Y., Liu M. S., & Jen, A. K., "Synthesis, Properties, and Application of New Luminescent Polymers with Both Hole and Electron Injection Abilities for Light–Emitting Devices," Chemistry of Materials, vol. 11, pp. 1568–1575 (1999).

Miyaura, N. and Akira, S., "Palladium–Catalyzed Cross–Coupling Reactions of Organoboron Compounds," Chemical Reviews, vol. 95, No. 7, pp. 2457–2483 (1995).

Nishiyama, M., Yamamoto, T., & Kole, Y., "Synthesis of N–Arylpiperazines from Aryl Halides and Piperazine under a Palladium Tri–tert–butylphosphine Catalyst," Tetrahedron Letters, vol. 39, p. 617 (1998).

Wolfe, J. P., Wagaw, S., Marcoux, J. F. & Buchwald, S. L., "Rational Development of Practical Catalysts for Aromatic Carbon–Nitrogen Bond Formation," Accounts of Chemical Research, vol. 31, p. 805 (1998).

Zerza, G. & Gomez, F., "Photophysical Properties and Optoelectronic Device Applications of a Novel Naphthalene–Vinylene Type Conjugated Polymer,"2001 American Chemical Society, J. Phys. Chem. vol. 105, pp. 4099–4104.

* cited by examiner

DSC curve of compound (2).

PL spectrum of compound (4) in CHCl$_3$.

FIGURE 3

| 6 |
|---|
| 5 |
| 4 |
| 3 |
| 2 |
| 1 |

BINAPHTHALENE DERIVATIVES FOR ORGANIC ELECTRO-LUMINESCENT DEVICES

BACKGROUND OF THE INVENTION

1. Field of the Invention

The present invention relates to an organic light emitting device (OLED) in which a binaphthalene derivative is used as the emissive layer and/or one or more of the charge transport layers, or as a host or dopant material for one or more of such layers.

2. Description of the Related Art

Significant efforts have been expended in developing suitable materials for use in organic light emitting devices (OLEDs). Such devices are commercially attractive because they offer the promise of low-cost fabrication of high-density pixeled displays exhibiting bright electroluminescence with long life times and a wide range of colors.

A typical OLED is fabricated by sandwiching an emissive layer between an anode and a cathode. Improved performance can be obtained by the provision of additional layers around the emissive layers so as to provide charge transport capabilities, such as an electron transport layer or a hole transport layer. Some of these layers can be combined. For example, a double-layered structure is fabricated from a combined hole-injecting and transporting layer together with a combined electron-transporting and light-emitting layer. Likewise, a triple-layered structure is composed of a hole-injecting and transporting layer, a light-emitting layer, and an electron-injecting and transporting layer.

In addition, it is possible to form these layers from a host material doped with another material designed to achieve the desired effect of the layer (that is, to achieve a hole transport effect, an electron transport effect, or an emissive effect).

Because of consumer expectations of good efficiency, long life time and pure color, a need exists for development of suitable materials for the various layers.

SUMMARY OF THE INVENTION

It is an object of the invention to provide an improved OLED in which a binaphthalene derivative is used as the emissive layer and/or one or more of the charge transport layers, or as a host or dopant material for one or more of such layers.

1,1' binaphthalene derivatives represent an important class of chiral auxiliaries. The large dihedral angle between the napthyl groups ensures a high degree of stereo-selectivity and the resulting non co-planer binapthyl unit prevents close molecular packing. As a result, when incorporated into OLEDs, especially in the emissive layer, a high photo-luminescent efficiency and a possible high electro-luminescent efficiency can be achieved.

Thus, in one aspect, the invention is an OLED in which an emissive layer is sandwiched between at least a cathode and an anode, and in which the emissive layer includes a binaphthalene derivative expressed according to the following general formula (I):

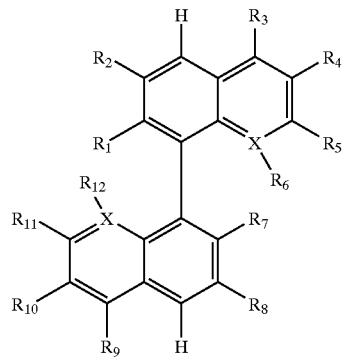

(I)

wherein each of $R_1$ to $R_{12}$ independently represents a hydrogen atom, an alkyl group, an alkoxy group, a vinyl group, an aromatic compound, or a hetro-aromatic compound, and the 4 and 4' positions on the naphthalene rings are unsubstituted as shown. X can represent either carbon or nitrogen atoms, however, if X represents nitrogen, then $R_6$ and $R_{12}$ are limited to representing only hydrogen atoms.

The compound expressed according to formula (I) can be used directly as the emissive layer, or can be used as a host material for an emissive dopant in a case where the emissive layer comprises a binaphthalene derivative host plus an emissive dopant. The emissive dopant can also be a compound expressed according to formula (I) as specified above.

When the compound expressed according to formula (I) is a chiral molecule, and when the optically active enantiomers of the compound are isolated into separate R and S enantiomers, the light produced in the emissive layer by the resolved binaphthalene derivative is polarized.

In a further aspect, the invention is an OLED having an emissive layer sandwiched between at least one charge transport layer and an anode and a cathode. The charge transport layer can be either an electron transport layer or a hole transport layer, or both. According to this aspect of the invention, the charge transport layer includes a binaphthalene derivative according to the above general formula (I) as specified above.

According to this aspect, the compound expressed according to formula (I) can be used directly as the charge transport layer, or can form a charge transport host material in a case where the charge transport layer comprises a host material plus a charge transport dopant.

This brief summary has been provided so that the nature of the invention may be understood quickly. A more complete understanding of the invention can be obtained by reference to the following detailed description of the preferred embodiment thereof in connection with the attached drawings.

BRIEF DESCRIPTION OF THE DRAWINGS

Figure 3:
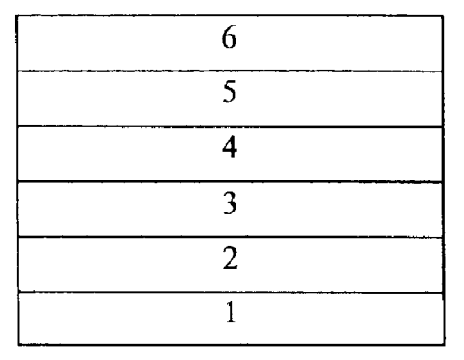

FIG. 3 is a schematic cross-sectional view of an OLED according to the invention.

DETAILED DESCRIPTION OF THE PREFERRED EMBODIMENTS

Binaphthalene has the following structure:

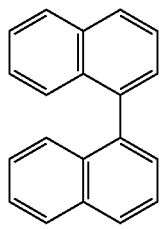

The present invention relates to organic light-emitting devices containing binaphthalene derivatives having the following general structure:

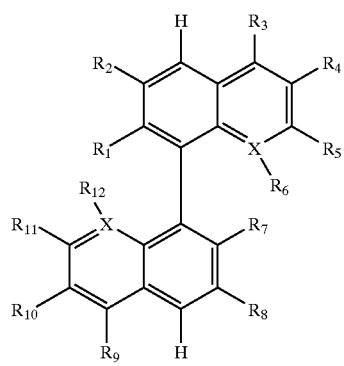

(I)

In the above formula (I), $R_1$ through $R_{12}$ can be substituted or unsubstituted independently, depending upon the starting materials used in the synthesis, or to achieve desired properties. Substituents may include, without limitation, a hydrogen atom, an alkyl group, an alkoxy group, a vinyl group, an aromatic compound, or a hetero-aromatic compound. Preferably, $R_1$ through $R_{12}$ are emissive, and/or charge-transporting groups for organic light-emitting device (OLED) applications.

As shown, the 4 and 4' positions on the naphthalene rings are unsubstituted. Additionally, in the above formula (I), X represents either a carbon or a nitrogen atom, however, if X represents a nitrogen atom, then $R_6$ and $R_{12}$ represent hydrogen atoms.

The binaphthylene derivatives used in the present invention are small molecules as opposed to large polymers.

In a preferred embodiment of the present invention, the optically active enantiomers of the compound are isolated into separate R and S enantiomers. When the binaphthalene derivative is resolved and used as an emissive layer in an OLED, the light emitted will be polarized.

According to another preferred embodiment, the binaphthylene derivative is substituted at the 2 and 2' positions, giving the chemical structure a twisted conformation. In this embodiment, $R_1$ and $R_7$, in Formula (I) represent a substituent group other than hydrogen. More preferably, $R_1$ and $R_7$ represent substituents which impart the compound with emissive, hole transport or electron transport properties. Arylamine groups are examples of suitable hole transport groups. Substituents which may be used to impart electron transport properties include, but are not limited to, oxadiazoles, thiadiazoles or triazoles, diaryl sulfones, aryl sulfoxide, fluorinated aryls, biphenyls, diaryl phosphine oxides and benzophenones. Aryl-substituted oxadiazole, thiadiazole or triazole are particularly preferred as electron transport substituents.

Figure 1:
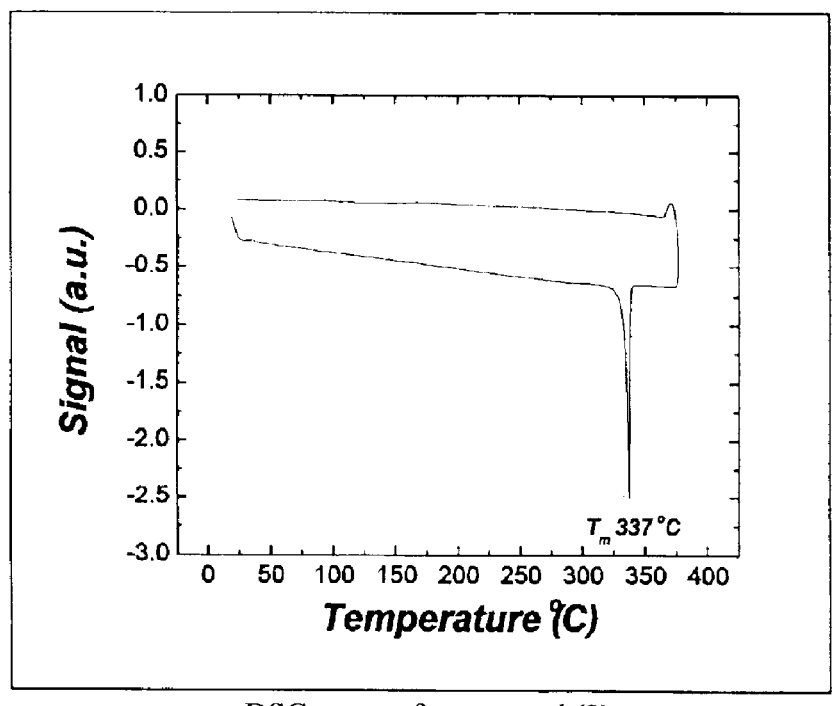
FIG. 1 is a differential scanning calorimetry (DSC) curve of Compound 2.

FIG. 1 schematically depicts an OLED according to the invention, including transparent substrate 1, anode 2 adjacent the substrate, hole transport layer 3 adjacent the anode, emissive layer 4, electron transport layer 5, and cathode 6. Each of these layers may itself comprise multiple layers of material having similar composition or function.

A binaphthylene of formula (I) can be used in an OLED in a number of ways. In one aspect, the binaphthalene derivative is included in the emissive layer of an OLED, in which the emissive layer is sandwiched between at least one cathode and one anode. Here, the binaphthalene derivative can be the emissive layer host, the emissive dopant, or both.

In addition to the emissive layer, another OLED of the present invention has a charge-transport layer sandwiched between a cathode and an anode, where the charge-transport layer includes a binaphthalene derivative conforming to formula (I) described above. The derivative can be a component of the electron-transport layer, the hole-transport layer or both. As a component of these layers, the binaphthalene derivative can serve as either host or charge transport dopant.

Binaphthylene materials suitable for use with the invention or as starting materials for preparing derivatives according to the invention, can be made using methods known in the art. These methods include, but are not limited to Suzuki coupling reactions and palladium(0)-catalyzed amination reactions. See *Accounts of Chemical Research*, Vol. 31, p. 805 (1998); *Angewandte Chemie International Edition English*, Vol. 37, p. 2047 (1998); *Chemical Reviews*, Vol. 95, No. 7, pp. 2457–2483 (1995); and *Tetrahedron Letters*, Vol. 39, p. 617 (1998), incorporated herein by reference.

An advantage of the disclosed binaphthylene derivative materials for use in OLEDs according to the invention is that they prevent close molecular packing. This advantage is due to the large dihedral angle between the two naphthyl groups. When close molecular packing is prevented, the result in an OLED is high photo and electro-luminescent efficiency.

OLEDs of the present invention can be fabricated by first obtaining a clean substrate with an ITO patterned thereon. Then, the substrate is treated with $O^2$ plasma for 1 to 5 minutes. Once treated, the substrate is placed in a thermal evaporator and the pressure is pumped down below $6 \times 10^{-6}$ torr. An emissive layer, either with or without a dopant, is then evaporated onto the substrate. Optionally, a hole transport layer and/or an electron transport layer are also evaporated onto the substrate. Finally, another electrode layer is deposited thereon.

A preferred hole transporting material is 1,4-bis[(1-naphthyphenyl)-amino]biphenyl (NPD) and has the following structure:

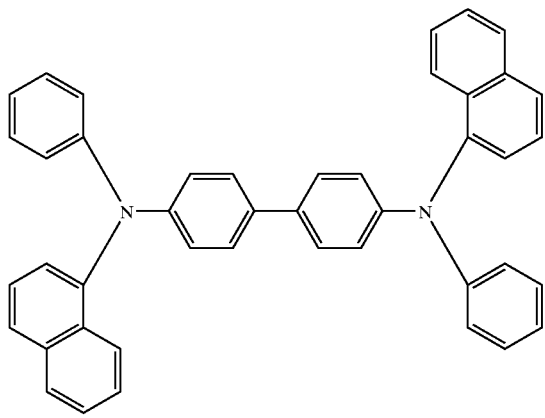

1,4-bis[(1-naphthyphenyl)-amino]biphenyl (NPD)

A preferred electron transport material is 4,7-diphenyl-1,10-phenanthroline (Bphen) and has the following structure:

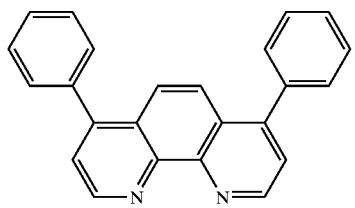

4,7-diphenyl-1,10-phenanthroline (Bphen)

A suitable emissive material which may be used in the present invention is aluminum tris(8-hydroxyquinoline) (AlQ3) having the following structure:

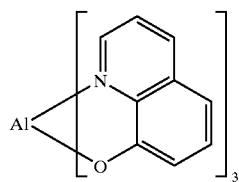

AlQ$_3$ (aluminum tris(8-hydroxyquinoline))

A number of binaphthalene derivatives have been synthesized to test their suitability for use in OLEDs.

EXAMPLE 1

Compound (1)

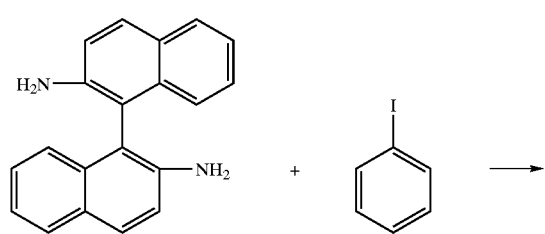

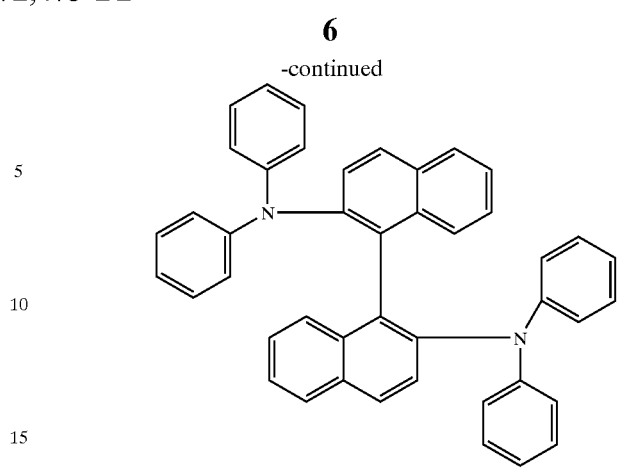

Compound (1) was synthesized using palladium(0)-catalyzed amination reactions as described in references cited above. A round-flask was charged with 2,2'diamino-1,1'-binaphthyl (0.568 g, 2 mmol), iodobenzene (1.14 mL, 10 mmol), NaOt-Bu (0.96 g, 10 mmol), bis(tri-t-butylphosphine)palladium(0) (50 mg) and 1,4-dioxane (25 mL). The mixture was stirred at 80° C. under N$_2$ for two days. After cooling down, the mixture was poured into water. The product was then extracted with toluene, washed with water and dried over MgSO$_4$. After filtration and concentration, it was purified through column chromatography (Silica gel, mixtures of CH2Cl$_2$/Hexanes). A thermogravametric analysis (TGA) scan indicated a thermal decomposition temperature of 305° C. Compound (1) can be fabricated into an OLED using the above generalized procedure.

EXAMPLE 2

Compound (2)

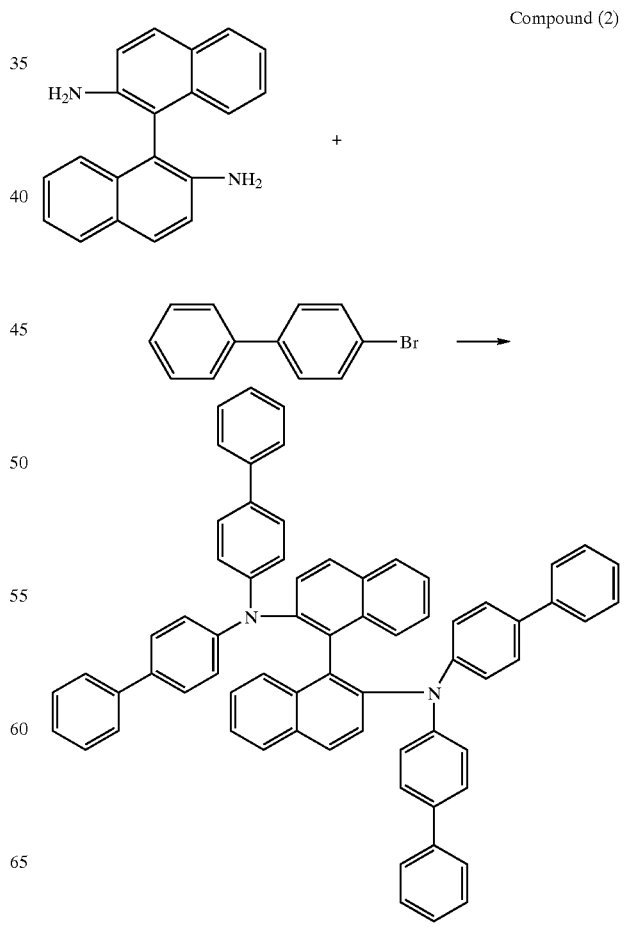

Compound (2) was synthesized in a way similar to Compound 1, as described above. The difference being that 4-bromobiphenyl was used in place of iodobenzene. Differential scanning calorimetry (DSC) showed a very high melting point of 337° C., while TGA indicated a high decomposition temperature of 440° C. The results of the DSC scan are shown in FIG. 1. Compound 2 has a HOMO value of −5.58 eV, and a LUMO of −2.48 eV. Compound (2) can be fabricated into an OLED using the above generalized procedure.

EXAMPLE 3

Compound (3)

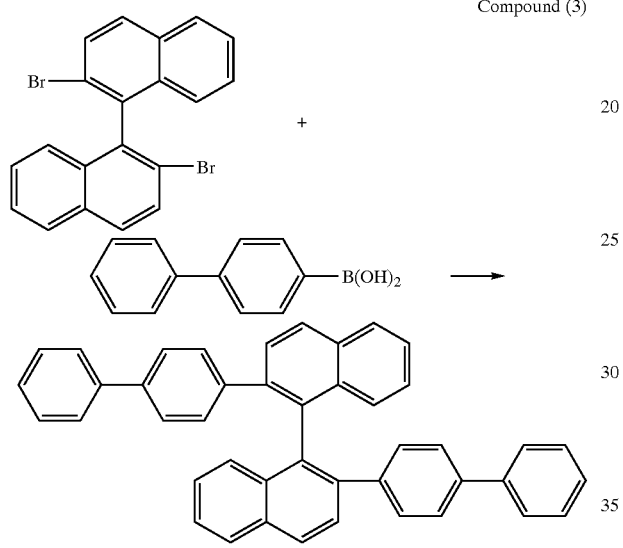

Compound (3) was synthesized using Suzuki coupling reactions and palladium(0)-catalyzed amination reaction, described in the references cited above. A round-flask was charged with 2,2'-dibromo-1,1'-binaphthyl (0.824 g, 2 mmol), 4-biphenylboronic acid (1.6 g, 8 mmol), Pd(P-t-Bu$_3$)$_2$ (80 mg), NaOt-Bu (0.96 g, 10 mmol), and 30 mL of dry o-xylene. The mixture was stirred at 110° C. under N$_2$ for two days. After cooling down, the mixture was poured into water. The product was then extracted with toluene, washed with water, and dried over MgSO$_4$. After filtration and concentration, it was purified through column chromatography (Silica gel, mixtures of CH2Cl$_2$/Hexanes), and recrystallized from toluene/hexane. A DSC scan indicated the compound has a melting temperature of 272° C. Compound (3) can be fabricated into an OLED using the above generalized procedure.

EXAMPLE 4

Compound (4)

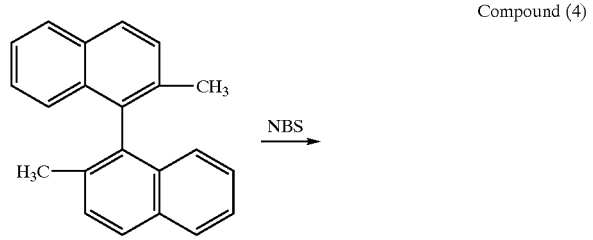

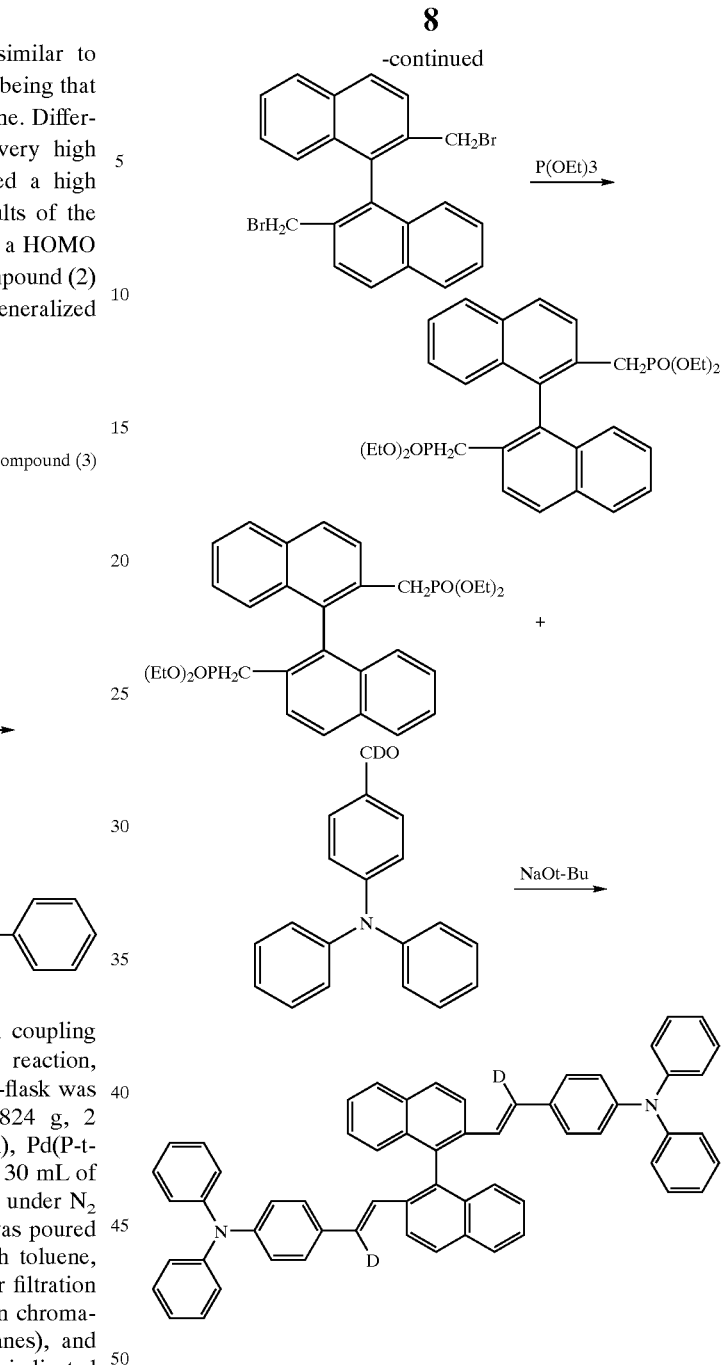

Figure 2:
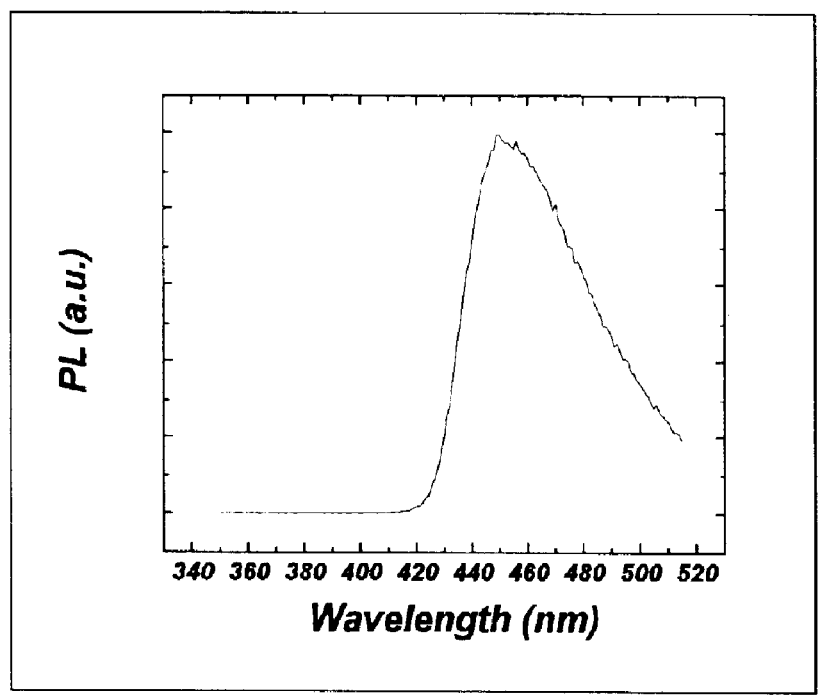
FIG. 2 is a PL spectrum of Compound 4 in $CHCl_3$.

Compound (4) was synthesized via a few step reactions. 2,2'-dibromomethyl-1,1'-binaphthyl was obtained by reaction of NBS with 2,2'-dimethyl-1,1'-binaphthyl according to a procedure disclosed in *Synthesis*, pp. 317–320 (1985) incorporated herein by reference. Refluxing of 2,2'-dibromomethyl-1,1'-binaphthyl in an excess of triethylphosphite afforded the ester compound. The deuterated 4-aldehydetriphenylamine was obtained by a reaction of triphenylamine (1 equiv.) and deuterated DMF-d7 (1.4 equiv.) in the presence of POCl$_3$ (1.2 equiv.) according to a similar reference procedure disclosed in *Chemistry of Materials*, Vol. 11, pp. 1568–1575 (1999). Finally, a round-flask was charged with a 1,1'-binaphthyl ester compound (0.77 g, 1.39 mmol), deuterated 4-aldehydetriphenylamine (0.8 g, 2.92 mmol), NaOt-Bu (0.4 g, 4.17 mmol), and 10 mL of dry DMF. The mixture was stirred at room temperature under $N_2$ for two days. The mixture was poured into 100 mL of water. The precipitate was filtrated and washed with water and methanol. The finished product was purified through column chromatography (Silica gel, mixtures of $CH_2Cl_2$/Hexanes). Compound (4) has a Tg at 122° C. by DSC and shows a strong blue emission as shown in FIG. 2. This compound can be fabricated into an OLED using the above generalized procedure

EXAMPLE 5

An OLED was made in accordance with the procedures disclosed above. The device was constructed with a ITO anode with NPD deposited thereon to act as a hole transporter. Bphen was used as an electron transporter while a lithium aluminum alloy was used as the cathode. In this device, an emissive layer was also present. Compound (3) was the host, while Compound (4) was the dopant.

The driving voltage was applied to the obtained device by connecting the ITO electrode to a positive electrode(+) and the cathode of Al to a negative electrode(−) to test emission of light, and a uniform light of blue color was obtained. The density of the electric current produced by the device was 100 mA/cm2 at 7 V; the luminescence of the device was measured at 1350 cd/m$^2$ at 7 V; the maximum external quantum efficiency of the OLED was 1.2% and the maximum external power efficiency 1.0 lm/W. CIE color coordinates were (0.19, 0.22).

EXAMPLE 6

An OLED was fabricated in accordance with the procedures disclosed above, where Compound (1) was a hole transporter and $AlQ_3$ was a green emitter and electron transporter. Upon applying a positive bias, the device emitted green light, peaking at 520 nm, typical of AlQ3 emission. The luminescence of the device was 10,000 cd/m$^2$ at 14 V.

EXAMPLE 7

Another OLED was fabricated in accordance with the procedures disclosed above, where Compound (2) was a hole transporter, $AlQ_3$ was a green emitter and electron transporter. Upon applying a positive bias, the device emitted green light, peaking at 520 nm, which is typical of an $AlQ_3$ emission. The luminescence of this device was measured at 12,000 cd/m$^2$ at 11 V.

The foregoing examples are illustrative only and are not to be deemed limiting of the invention, which is defined by the following claims and is understood to include such obvious variations and modifications as would be obvious to those of ordinary skill in the art.

What is claimed is:

1. An organic light emitting device comprising:

an anode, a cathode, and at least one or more organic layers sandwiched between said anode and said cathode, wherein at least one of said organic layers has a binaphthalene derivative expressed according to the following formula:

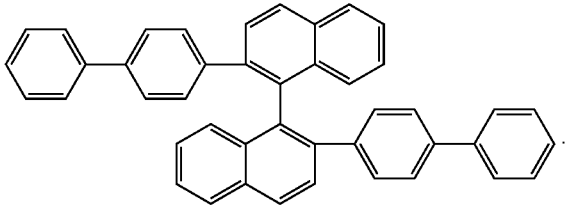

Compound (3)

2. An organic light emitting device according to claim 1, wherein at least one of said organic layers is an emissive layer and said binaphthalene derivative is comprised therein as a host.

3. An organic light emitting device comprising:

an anode, a cathode, and at least one or more organic layers sandwiched between said anode and said cathode, wherein at least one of said organic layers has a binaphthalene derivative expressed according to the following formula:

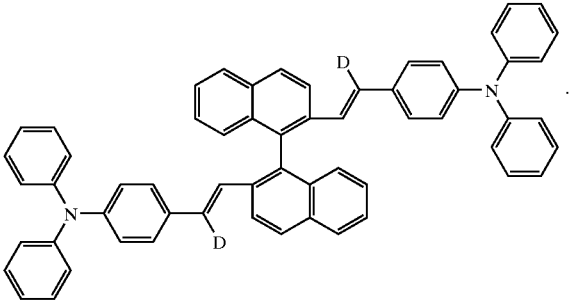

Compound (4)

4. An organic light emitting device according to claim 3, wherein at least one of said organic layers is an emissive layer and said binaphthalene derivative is comprised therein as a dopant.

* * * * *